(12) United States Patent
Ko

(10) Patent No.: US 8,508,044 B2
(45) Date of Patent: Aug. 13, 2013

(54) SEMICONDUCTOR PACKAGE, SEMICONDUCTOR DEVICE, AND SEMICONDUCTOR MODULE

(75) Inventor: Ji-Han Ko, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 13/102,302

(22) Filed: May 6, 2011

(65) Prior Publication Data

US 2011/0272805 A1    Nov. 10, 2011

(30) Foreign Application Priority Data

May 10, 2010    (KR) .................. 10-2010-0043646

(51) Int. Cl.
*H01L 23/48*    (2006.01)
(52) U.S. Cl.
USPC ........... 257/738; 257/685; 257/686; 257/692; 257/723; 257/737
(58) Field of Classification Search
None
See application file for complete search history.

(56) References Cited

U.S. PATENT DOCUMENTS

2004/0056277 A1* 3/2004 Karnezos ...................... 257/200
2005/0269699 A1    12/2005 Haw et al.

FOREIGN PATENT DOCUMENTS

| JP | 2007-142124 | 6/2007 |
|---|---|---|
| JP | 2009-135233 | 6/2009 |
| KR | 10-2007-0068439 A | 6/2007 |

* cited by examiner

*Primary Examiner* — Kyoung Lee
(74) *Attorney, Agent, or Firm* — Lee & Morse, P.C.

(57) ABSTRACT

A semiconductor package, a semiconductor device, and a semiconductor module, the semiconductor package including a substrate, the substrate having a plurality of inner pads; a semiconductor chip attached to the substrate, the semiconductor chip being electrically connected to the inner pads; a plurality of lands on the substrate, the plurality of lands being electrically connected to the inner pads; and at least one bypass interconnection on the substrate, wherein the plurality of lands includes a first land and a second land, the bypass interconnection is connected to the first land and the second land, and the first land is spaced apart from the second land by a distance of about three times or greater an average distance between adjacent lands of the plurality of lands.

19 Claims, 11 Drawing Sheets

SEMICONDUCTOR PACKAGE, SEMICONDUCTOR DEVICE, AND SEMICONDUCTOR MODULE

CROSS REFERENCE TO RELATED APPLICATION

Korean Patent Application No. 10-2010-0043646, filed on May 10, 2010, in the Korean Intellectual Property Office, and entitled: "Semiconductor Package Having Dual Lands and Related Devices," is incorporated by reference herein in its entirety.

BACKGROUND

1. Field

Embodiments relate to a semiconductor package, a semiconductor device, and a semiconductor module.

2. Description of Related Art

To meet demand for light, thin, short, and small electronic devices, research is being conducted into a package-on-package (PoP). PoP refers to a package that may enhance integration density by stacking a same type or different types of semiconductor packages and reducing a horizontal mounting area.

SUMMARY

Embodiments are directed to a semiconductor package, a semiconductor device, and a semiconductor module.

The embodiments may be realized by providing a semiconductor package including a substrate, the substrate having a plurality of inner pads; a semiconductor chip attached to the substrate, the semiconductor chip being electrically connected to the inner pads; a plurality of lands on the substrate, the plurality of lands being electrically connected to the inner pads; and at least one bypass interconnection on the substrate, wherein the plurality of lands includes a first land and a second land, the bypass interconnection is connected to the first land and the second land, and the first land is spaced apart from the second land by a distance of about three times or greater an average distance between adjacent lands of the plurality of lands.

At least two other lands of the plurality of lands may be between the first land and the second land.

A number of the plurality of lands may be about 1.2 to about 2 times a number of the inner pads.

The first land may be adjacent to a corner of the substrate, and the second land may be adjacent to a center of the substrate.

The plurality of lands may include a first group arranged in a row direction, and a second group extending from one end of the first group and arranged in a column direction, the first land being adjacent to a center of the first group and the second land being adjacent to a center of the second group.

The package may further include conductive patterns attached to the lands, wherein the conductive patterns are formed of one of a solder ball, a solder paste, a conductive bump, a conductive spacer, a lead grid array (LGA), a pin grid array (PGA), an anisotropic conductive film (ACF), and an anisotropic conductive paste (ACP).

The package may further include a lower substrate attached to the substrate, the lower substrate having lower lands respectively corresponding to the plurality of lands; and a lower semiconductor chip attached to the lower substrate.

The conductive patterns may include a first conductive pattern and a second conductive pattern, and the lower lands may include a first lower land and a second lower land, the first conductive pattern being in contact with the first land and the first lower land, and the second conductive pattern being in contact with the second land and the second lower land.

The conductive patterns may include a first conductive pattern and a second conductive pattern, and the lower lands may include a first lower land and a second lower land, the first conductive pattern being in contact with the first land and the first lower land, and the second conductive pattern being in contact with the second land and separated from the second lower land.

The lower lands may include a first lower land and a second lower land and the lower substrate may include a plurality of external pads electrically connected to the lower lands; and a lower bypass interconnection on the lower substrate, the lower bypass interconnection being connected to the first lower land and the second lower land.

The embodiments may also be realized by providing a semiconductor device including a mother board, the mother board having a plurality of substrate lands; an upper substrate on the mother board, the upper substrate having a plurality of inner pads; a semiconductor chip attached to the upper substrate, the semiconductor chip being electrically connected to the inner pads; a plurality of upper lands on the upper substrate, the plurality of upper lands being electrically connected to the inner pads and the substrate lands; and at least one upper bypass interconnection on the upper substrate, wherein the plurality of upper lands includes a first upper land and a second upper land, the at least one upper bypass interconnection is connected to the first upper land and the second upper land, and the first upper land is spaced apart from the second upper land by a distance of about three times or greater an average distance between adjacent upper lands of the plurality of upper lands.

The device may further include upper conductive patterns attached to the upper lands, wherein the upper conductive patterns are formed of one of a solder ball, a solder paste, a conductive bump, a conductive spacer, an LGA, a PGA, an ACF, and an ACP.

The upper conductive patterns may include a first upper conductive pattern and a second upper conductive pattern, and the substrate lands may include a first substrate land and a second substrate land facing the second upper land, the first upper conductive pattern being between the first upper land and the first substrate land, and the second upper conductive pattern being between the second upper land and the second substrate land.

The device may further include a base bypass interconnection on the mother board, wherein the base bypass interconnection is connected to the first substrate land and the second substrate land.

The first upper land may be adjacent to a corner of the upper substrate, and the second upper land may be adjacent to a center of the upper substrate.

The plurality of upper lands may include a first group arranged in a row direction, and a second group extending from one end of the first group and arranged in a column direction, the first upper land being adjacent to a center of the first group, and the second upper land being adjacent to a center of the second group.

The device may further include a lower substrate attached between the mother board and the upper substrate, the lower substrate including lower lands respectively corresponding to the upper lands, a plurality of external pads corresponding to the substrate lands, and a plurality of lower bypass interconnections connected to the lower lands and the external pads; a lower semiconductor chip attached to the lower substrate; and lower conductive patterns between the external pads and the substrate lands.

The lower lands may include a first lower land facing the first upper land and a second lower land facing the second upper land, and one of the lower bypass interconnections may be connected to the first lower land and the second lower land, and may be connected to one of the external pads.

The external pads may include a first external pad facing the first lower land and a second external pad facing the second lower land, the substrate lands may include a first substrate land facing the first external pad and a second substrate land facing the second external pad, and the lower conductive patterns may include a first lower conductive pattern between the first external pad and the first substrate land and a second conductive pattern between the second external pad and the second substrate land.

The embodiments may also be realized by providing a semiconductor module including a module substrate, the module substrate including input/output terminals thereon; a control chip package on the module substrate; and a plurality of semiconductor packages according to an embodiment on the module substrate.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION OF THE EMBODIMENTS

Figure 1:
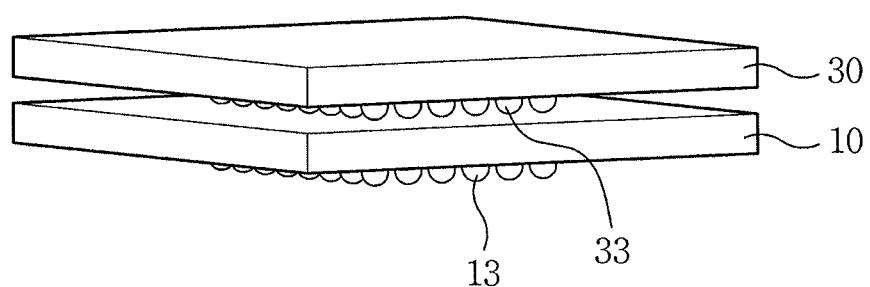
FIG. 1 illustrates a perspective view of a semiconductor package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 2:
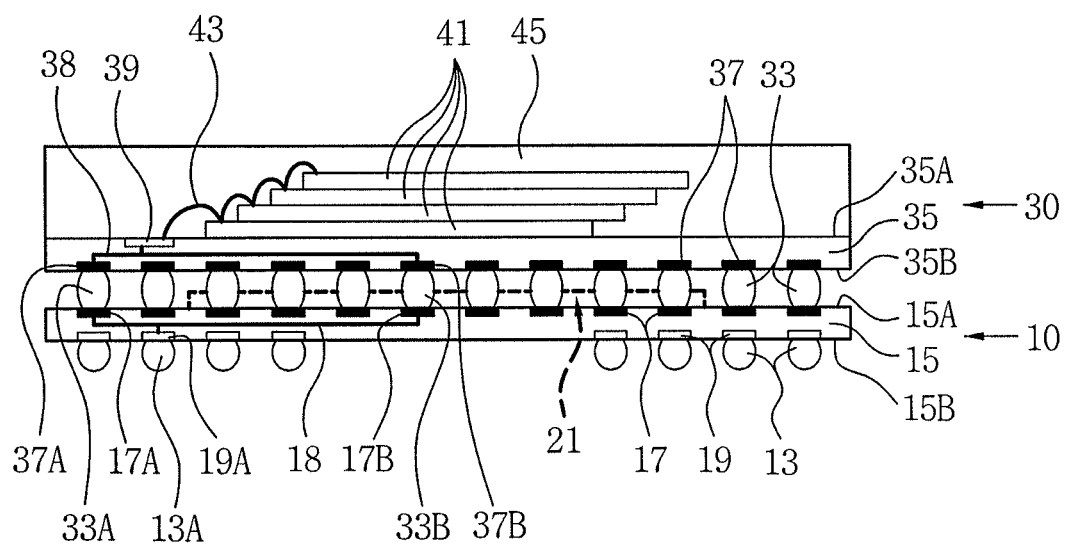
FIGS. 2 to 4 and FIGS. 8 to 12 illustrate cross-sectional views of implementations of the semiconductor package of FIG. 1.
Figure 3:
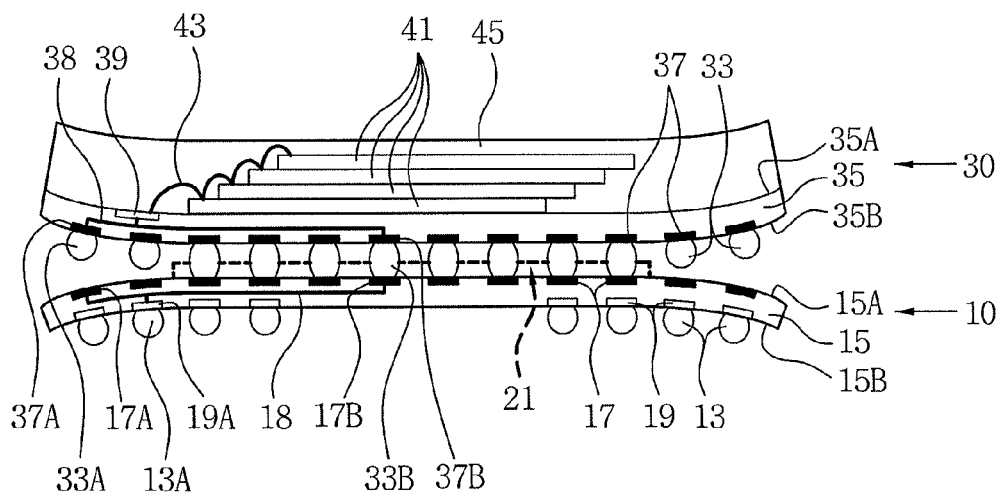
Figure 4:
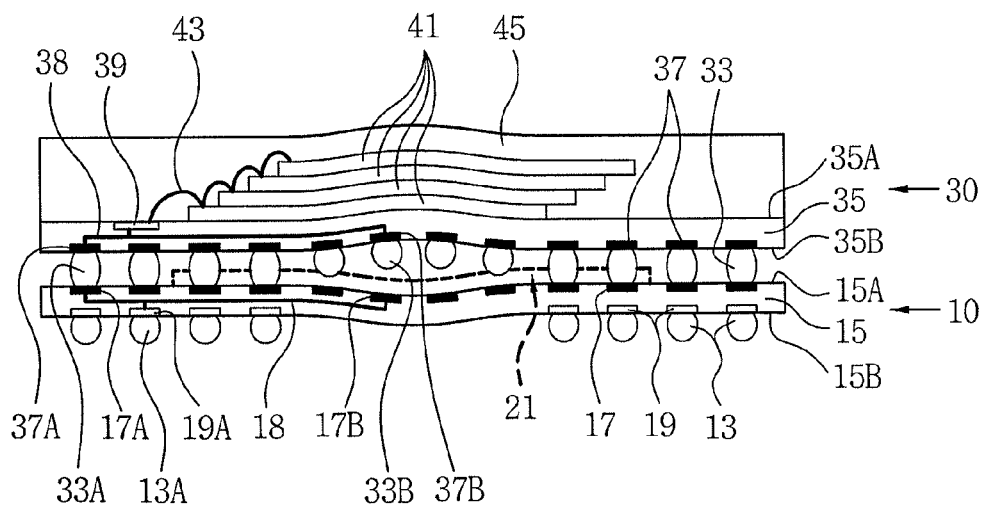
Figure 5:
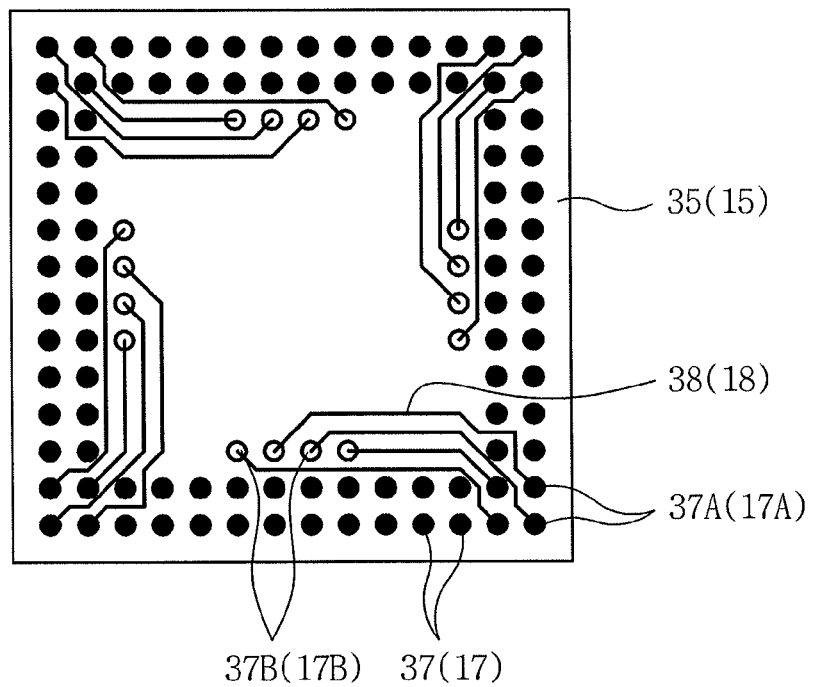
FIGS. 5 to 7 illustrate partial plan views of implementations of the semiconductor package of FIG. 1.
Figure 6:
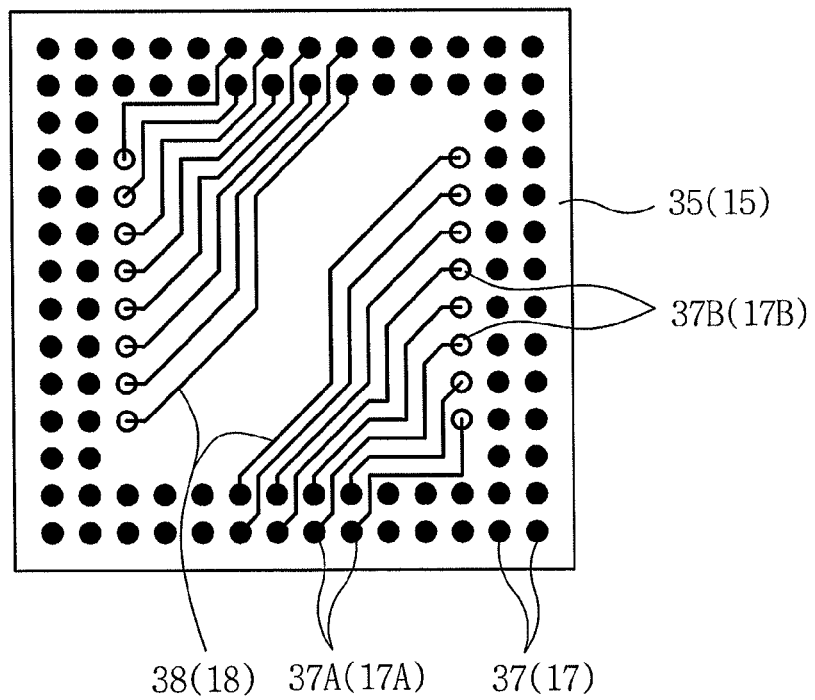
Figure 7:
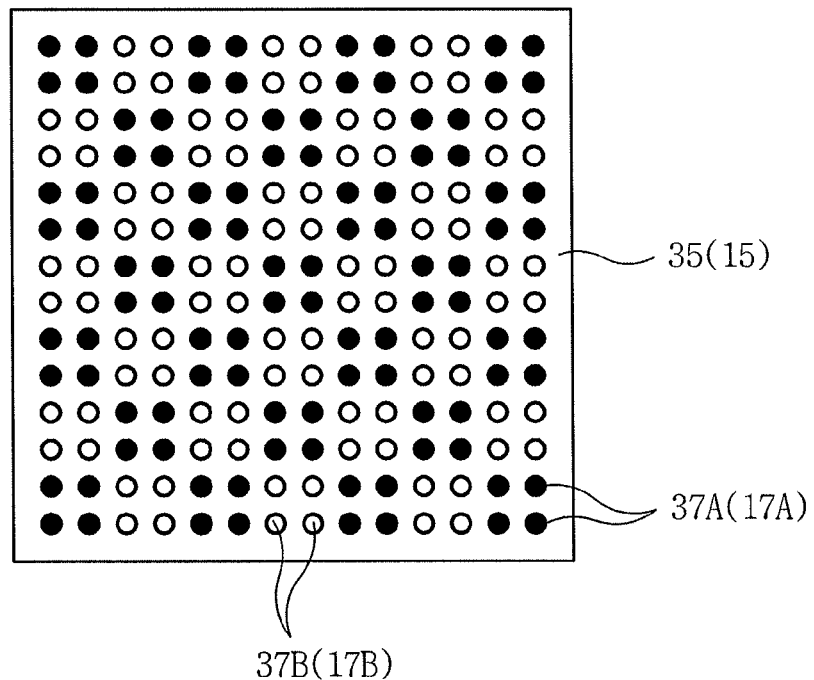
Figure 8:
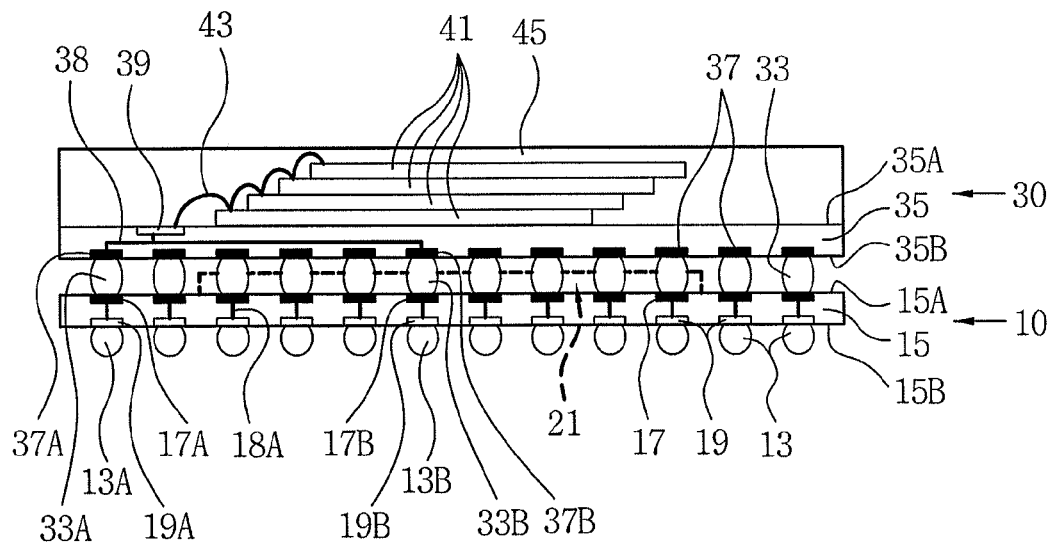
Figure 9:
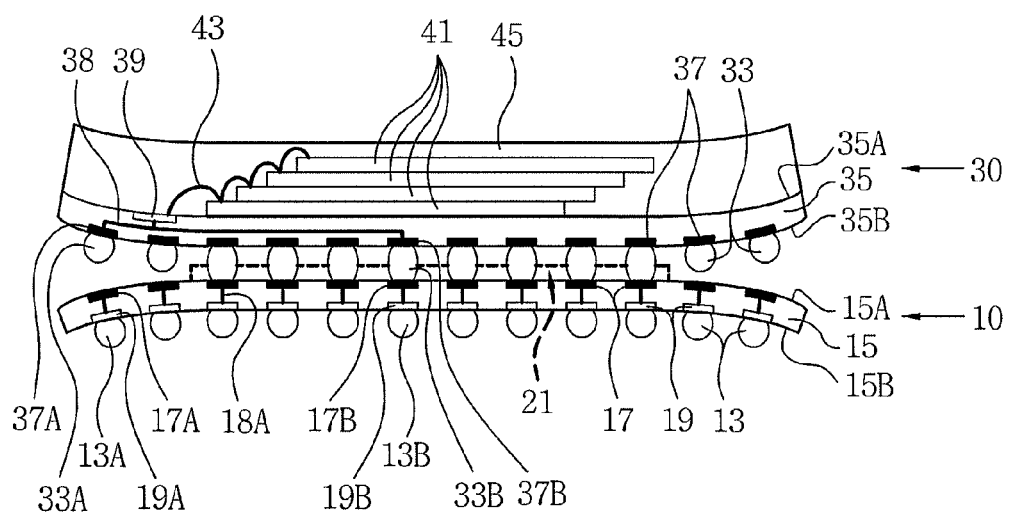
Figure 10:
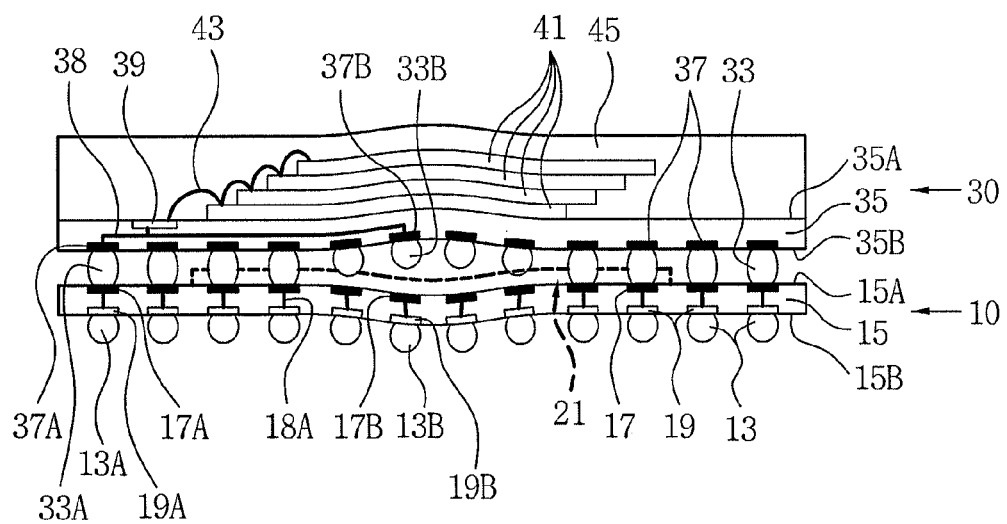
Figure 11:
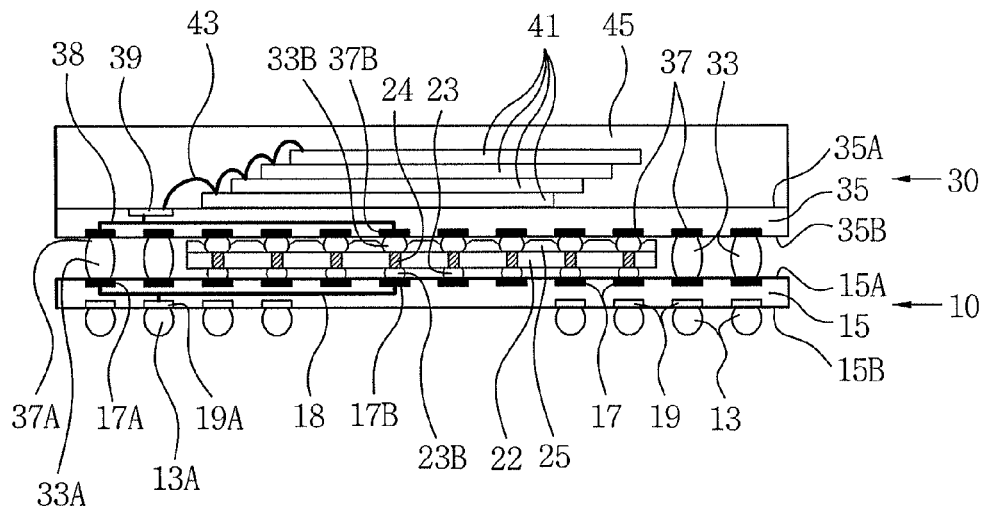
Figure 12:
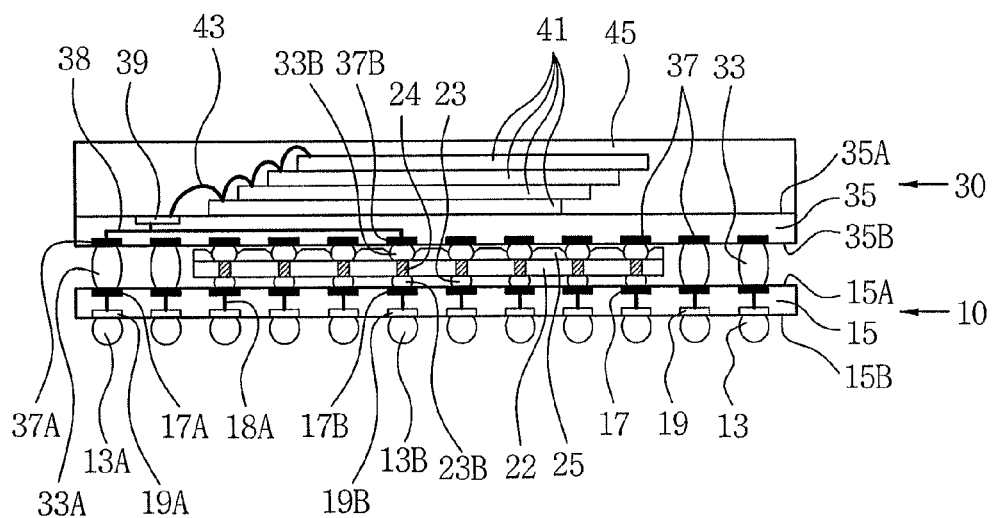

FIG. 1 illustrates a perspective view of a semiconductor package according an embodiment. FIGS. 2 to 4 illustrate cross-sectional views of the semiconductor package of FIG. 1. FIGS. 5 to 7 illustrate partial plan views of implementations of the semiconductor package of FIG. 1. FIGS. 8 to 10 illustrate cross-sectional views of implementations of the semiconductor package of FIG. 1. FIGS. 11 and 12 illustrate cross-sectional views of implementations of the semiconductor package of FIG. 1.

Referring to FIG. 1, a semiconductor package according to an embodiment may be a package-on-package (PoP) having a lower package 10 and an upper package 30. A plurality of lower conduction patterns 13 may be attached to one surface of the lower package 10 in row and column directions. A plurality of upper conductive patterns 33 may be attached to one surface of the upper package 30 in row and column directions. The upper package 30 may be attached on the lower package 10. The upper conductive patterns 33 may be interposed between the upper package 30 and the lower package 10. The lower conduction patterns 13 may be formed of one of a solder ball, a solder paste, a conductive bump, a conductive spacer, a lead grid array (LGA), a pin grid array (PGA), an anisotropic conductive film (ACF), and an anisotropic conductive paste (ACP). The upper conductive patterns 33 may be formed of one of a solder ball, a solder paste, a conductive bump, a conductive spacer, an LGA, a PGA, an ACF and an ACP. Hereinafter, an implementation in which the lower conduction patterns 13 and the upper conductive patterns 33 are formed of a solder ball will be described below.

In an implementation, the upper package 30 may be independently used, and the lower package 10 may be independently used as well.

Referring to FIG. 2, the upper package 30 may include a plurality of semiconductor chips 41 attached to an upper substrate 35. The upper substrate 35 may include a plurality of inner pads 39 and a plurality of upper lands 37. The inner pads 39 may be electrically connected to the upper lands 37. The upper lands 37 may include a first upper land 37A and a second upper land 37B. The first upper land 37A and the second upper land 37B may be electrically connected to one of the inner pads 39 via an upper bypass interconnection 38.

The upper substrate 35 may be formed of, e.g., a flexible printed circuit board, a rigid printed circuit board, or a combination thereof. In an implementation, the upper substrate 35 may be formed of a multilayer printed circuit board having about two to about eight inner interconnection layers (not shown). The inner pad 39 may be formed on a front surface 35A of the upper substrate 35; and the upper lands 37 may be formed on a rear surface 35B of the upper substrate 35. Some of the inner pads 39 may be data input/output pads, others may be power pads, and still others may be ground pads. The upper bypass interconnection 38 may be formed in the upper substrate 35. While a plurality of bypass interconnections (not shown) similar to the upper bypass interconnection 38 may be formed in the upper substrate 35, descriptions thereof will be omitted for clarity.

A number of the upper lands 37 may be about 1.2 to about 2 times a number of the inner pads 39. At least two of the upper lands 37 may be formed between the first upper land 37A and the second upper land 37B. The first upper land 37A may be adjacent to an edge or corner of the upper substrate 35; and the second upper land 37B may be adjacent to a center of the upper substrate 35. The first upper land 37A may be spaced apart from the second upper land 37B by a distance of about three times or greater an average distance between adjacent upper lands 37.

The upper conductive patterns 33 may be attached on the upper lands 37. The upper conductive patterns 33 may include a first upper conductive pattern 33A (attached to the first upper land 37A) and a second upper conductive pattern 33B (attached to the second upper land 37B).

The upper lands 37 may be formed of a conductive layer including one of a Cu layer, a W layer, a WN layer, a Ni layer, a Co layer, a Fe layer, a Ti layer, a TiN layer, a Ta layer, a TaN layer, an Al layer, an Au layer, an Ag layer, a Pt layer, a Pd layer, an Sn layer, and a combination thereof. The upper bypass interconnection 38 may be formed of a conductive layer including one of a Cu layer, a W layer, a WN layer, an Ni layer, a Co layer, a Fe layer, a Ti layer, a TiN layer, a Ta layer, a TaN layer, an Al layer, an Au layer, an Ag layer, a Pt layer, a Pd layer, an Sn layer, and a combination thereof. The inner pads 39 may be formed of a conductive layer including one of a Cu layer, a W layer, a WN layer, an Ni layer, a Co layer, a Fe layer, a Ti layer, a TiN layer, a Ta layer, a TaN layer, an Al layer, an Au layer, an Ag layer, a Pt layer, a Pd layer, an Sn layer, and a combination thereof.

As shown in FIG. 2, the semiconductor chips 41 may constitute a cascade stack. The semiconductor chips 41 may be electrically connected to the inner pads 39 with a bonding wire 43. An encapsulating material 45 covering the semiconductor chips 41 may be formed on the upper substrate 35. Each of the semiconductor chips 41 may include at least one of a volatile memory device (e.g., a Dynamic Random Access Memory (DRAM)), a non-volatile memory device (e.g., a flash memory), a microprocessor, and a logic device.

In an implementation, some of the semiconductor chips 41 may include semiconductor devices having difference functions. For example, one of the semiconductor chips 41 may be a control chip having a logic device, and some of the semiconductor chips 41 may be non-volatile memory chips (e.g., flash memory chips).

In an implementation, the semiconductor chips 41 may constitute an overhang stack. In another implementation, the semiconductor chips 41 may be electrically connected to the inner pads 39 with the bonding wire 43, a through silicon via (TSV), a conductive tape, a beam lead bonding, a solder ball, a solder paste, a conductive bump, a conductive spacer, an ACF, an ACP or a combination thereof. In yet another implementation, some of the semiconductor chips 41 may be electrically connected to the inner pads 39 using a flip chip bonding technique.

The lower package 10 may include a lower semiconductor chip 21 attached to a lower substrate 15. The lower substrate 15 may include a plurality of lower lands 17 and a plurality of external pads 19. The lower lands 17 may include a first lower land 17A and a second lower land 17B. The external pads 19 may include a first external pad 19A. The first external pad 19A may be electrically connected to the first lower land 17A and the second lower land 17B via a lower bypass interconnection 18. The first lower land 17A may be in contact with the first upper conductive pattern 33A; and the second lower land 17B may be in contact with the second upper conductive pattern 33B.

The lower substrate 15 may be formed of, e.g., a flexible printed circuit board, a rigid printed circuit board, or a combination thereof. In an implementation, the lower substrate 15 may be a multilayer printed circuit board having about two to about eight inner interconnection layers (not shown). The lower lands 17 may be formed on a front side 15A of the lower substrate 15; and the external pads 19 may be formed on a rear side 15B of the lower substrate 15. The lower lands 17 may face the upper lands 37. A number of the lower lands 17 may be equal to or greater than the number of the upper lands 37. The lower bypass interconnection 18 may be formed in the lower substrate 15.

A plurality of pads (not shown) electrically connected to the lower semiconductor chips 21 and similar to the lower lands 17 may be formed on the front side 15A of the lower substrate 15, however, a description thereof will be omitted for simplicity. A plurality of other bypass interconnections (not shown) similar to the lower bypass interconnection 18 may be formed in the lower substrate 15, however, a description thereof will be omitted for simplicity.

The number of the lower lands 17 may be about 1.2 to about 2 times that of the number of the inner pads 39. At least two other lower lands 17 may be between the first lower land 17A and the second lower land 17B. The first lower land 17A may be adjacent to an edge or corner of the lower substrate 15; and the second lower land 17B may be adjacent to a center of the lower substrate 15. A distance between the first lower land 17A and the second lower land 17B may be about three times or greater an average distance between adjacent lower lands 17.

The lower conductive patterns 13 may be attached on the external pads 19 and 19A. The lower conductive patterns 13 may include a first lower conductive pattern 13A attached to the first external pad 19A.

The first lower conductive pattern 13A may be electrically connected to the semiconductor chips 41 via the first external pad 19A, the lower bypass interconnection 18, the first lower land 17A, the first upper conductive pattern 33A, the first upper land 37A, the upper bypass interconnection 38, and the inner pad 39. In addition, the first lower conductive pattern 13A may be electrically connected to the semiconductor chips 41 via the first external pad 19A, the lower bypass interconnection 18, the second lower land 17B, the second upper conductive pattern 33B, the second upper land 37B, the upper bypass interconnection 38, and the inner pad 39. For example, a dual signal transmission path may be provided between the first lower conducting pattern 13A and the inner pad 39. Accordingly, the semiconductor package according to the present embodiment may exhibit improved electrical properties and reliability.

The lower lands 17 may be formed of a conductive layer including one of a Cu layer, a W layer, a WN layer, a Ni layer, a Co layer, a Fe layer, a Ti layer, a TiN layer, a Ta layer, a TaN layer, an Al layer, an Au layer, an Ag layer, a Pt layer, a Pd layer, an Sn layer, and a combination thereof. The lower bypass interconnection 18 may be formed of a conductive layer including one of a Cu layer, a W layer, a WN layer, an Ni layer, a Co layer, a Fe layer, a Ti layer, a TiN layer, a Ta layer, a TaN layer, an Al layer, an Au layer, an Ag layer, a Pt layer, a Pd layer, an Sn layer, and a combination thereof. The external pads 19 may be formed of a conductive layer including one of a Cu layer, a W layer, a WN layer, a Ni layer, a Co layer, a Fe layer, a Ti layer, a TiN layer, a Ta layer, a TaN layer, an Al layer, an Au layer, an Ag layer, a Pt layer, a Pd layer, an Sn layer, and a combination thereof.

The lower semiconductor chip 21 may be electrically connected to the lower lands 17 or other pads (not shown) similar to the lower lands 17 using, e.g., a bonding wire, a TSV, a conductive tape, a beam lead bonding, a solder ball, a solder paste, a conductive bump, a conductive spacer, an ACF, an ACP, or a combination thereof. For example, the lower semiconductor chip 21 may be electrically connected to the lower lands 17 using a flip chip bonding technique. In addition, while an encapsulating material (not shown) covering the lower semiconductor chip 21 may be formed on the lower substrate 15, a description thereof will be omitted for simplicity.

In an implementation, other semiconductor chips (not shown) having a similar constitution or structure to the semiconductor chips 41 may be formed on the lower substrate 15. The other semiconductor chips (not shown) may constitute or be arranged as a cascade stack or an overhang stack on the lower substrate 15. The other semiconductor chips (not shown) may be electrically connected to the lower lands 17 or other pads (not shown) similar to the lower lands 17 using, e.g., a bonding wire, a TSV, a conductive tape, a beam lead bonding, a solder ball, a solder paste, a conductive bump, a conductive spacer, an ACF, an ACP, or a combination thereof Each of the lower semiconductor chip 21 and the other semiconductor chips (not shown) may include at least one of a volatile memory device (e.g., a DRAM), a non-volatile memory device (e.g., flash memory), a microprocessor, and a logic device.

In an implementation, the lower package 10 may be omitted. In another implementation, one or more other packages having a similar constitution or structure to the lower package 10 may be stacked between the upper package 30 and the lower package 10.

Referring to FIG. 3, warping or bowing may occur in the upper package 30 and the lower package 10. For example, the upper package 30 may be bent in the shape of a bowl, and the lower package 10 may be bent in a direction opposite to the upper package 30. In this case, a gap may be created between the first upper conductive pattern 33A and the first lower land 17A. However, the inner pad 39 may still be electrically connected to the first lower conductive pattern 13A via the upper bypass interconnection 38, the second upper land 37B, the second upper conductive pattern 33B, the second lower land 17B, the lower bypass interconnection 18, and the first external pad 19A.

Referring to FIG. 4, the upper package 30 may be bent in the shape of a tunnel; and the lower package 10 may be bent in a direction opposite to the upper package 30. In this case, a gap may be created between the second upper conductive pattern 33B and the second lower land 17B. However, the inner pad 39 may still be electrically connected to the first lower conductive pattern 13A via the upper bypass interconnection 38, the first upper land 37A, the first upper conductive pattern 33A, the first lower land 17A, the lower bypass interconnection 18, and the first external pad 19A.

Referring to FIG. 5, the upper lands 37 may be included in various arrangements on the upper substrate 35. For example, the upper lands 37 may include a first group arranged at one side of the upper substrate 35 in a row direction, a second group starting or extending from an end of the first group and arranged in a column direction, a third group starting from another end of the first group and arranged in a column direction, and a fourth group facing the first group and crossing ends of the second and third groups.

A plurality of first upper lands 37A may be provided at intersections of the first to fourth groups. For example, the first upper lands 37A may be arranged adjacent to corners of the upper substrate 35. A plurality of second upper lands 37B may be provided adjacent to a center of the first group. Likewise, a plurality of other second upper lands 37B may be provided adjacent to centers of the second to fourth groups. The first upper lands 37A and the second upper lands 37B may be connected to each other via the upper bypass interconnections 38. For example, each of the first upper lands 37A may be electrically connected to one of the, e.g., different, respective, second upper lands 37B via corresponding upper bypass interconnections 38.

A distance between the first upper land 37A and the second upper land 37B (corresponding to the first upper land 37A) may be about three times or greater an average distance between adjacent upper lands 37. At least two other upper lands 37 may be disposed between the first upper land 37A and the second upper land 37B (corresponding to the first upper land 37A).

The lower lands 17 may be included in various arrangements on the lower substrate 15 as well. For example, the lower lands 17 may include a first group arranged at one side of the lower substrate 15 in a row direction, a second group starting or extending from an end of the first group and arranged in a column direction, a third group starting from another end of the first group and arranged in a column direction, and a fourth group facing the first group and crossing ends of the second and third groups.

A plurality of first lower lands 17A may be provided at intersections of the first to fourth groups. For example, the first lower lands 17A may be arranged adjacent to corners of the lower substrate 15. A plurality of second lower lands 17B may be provided adjacent to a center of the first group. Likewise, a plurality of other second lower lands 17B may be provided adjacent to centers of the second to fourth groups. The first lower lands 17A and the second lower lands 17B may be connected to each other via the lower bypass interconnections 18. For example, each of the first lower lands 17A may be electrically connected to one of the, e.g., respective, different, second lower lands 17B via corresponding lower bypass interconnections 18.

A distance between the first lower land 17A and the second lower land 17B (corresponding to the first lower land 17A)

may be about three times or greater am average distance between adjacent lower lands 17. At least two other lower lands 17 may be disposed between the first lower land 17A and the second lower land 17B (corresponding to the first lower land 17A).

Referring to FIG. 6, in an implementation, the upper lands 37 may include a first group arranged at one side of the upper substrate 35 in a row direction, a second group starting or extending from an end of the first group and arranged in a column direction, a third group starting from another end of the first group and arranged in a column direction, and a fourth group facing the first group and crossing ends of the second and third groups.

A plurality of first upper lands 37A may be provided adjacent to a center of the first group. Likewise, a plurality of other first upper lands 37A may be provided adjacent to a center of the fourth group. Further, a plurality of second upper lands 37B may be provided adjacent to a center of the second group. Likewise, a plurality of other second upper lands 37B may be provided adjacent to a center of the third group. The first upper lands 37A and the second upper lands 37B may be connected to each other via the upper bypass interconnections 38.

The lower substrate 15 may include the lower lands 17 thereon and having a similar arrangement to the upper lands 37 on the upper substrate 35.

Referring to FIG. 7, in an implementation, first upper lands 37A and second upper lands 37B may be alternatively and repetitively arranged in row and column directions on one surface of the upper substrate 35. The first upper lands 37A and the second upper lands 37B may be connected to each other using upper bypass interconnections (not shown). Likewise, the lower substrate 15 may include first lower lands 17A and second lower lands 17B, which may have a similar arrangement to the upper lands 37 on the upper substrate 35. The first lower lands 17A and the second lower lands 17B may be connected to each other using lower bypass interconnections (not shown).

Referring to FIG. 8, in an implementation, the upper package 30 may include an upper substrate 35, semiconductor chips 41, a bonding wire 43, inner pads 39, upper lands 37, upper bypass interconnections 38, upper conductive patterns 33, and an encapsulating material 45, and may have a similar constitution or structure to the upper package 30 illustrated in FIG. 2.

The lower package 10 may include a lower semiconductor chip 21 attached to the lower substrate 15. The lower substrate 15 may include a plurality of lower lands 17 and a plurality of external pads 19. The lower lands 17 may include a first lower land 17A and a second lower land 17B. The first lower land 17A may be in contact with the first upper conductive pattern 33A; and the second lower land 17B may be in contact with the second upper conductive pattern 33B. The external pads 19 may include a first external pad 19A and a second external pad 19B. The external pads 19 may face the lower lands 17. Lower bypass interconnections 18A may be provided between the external pads 19 and the lower lands 17.

A number of the lower lands 17 may be equal to or greater than a number of the upper lands 37. The external pads 19 may correspond to the lower lands 17, respectively. In an implementation, the external pads 19 may have a similar constitution or arrangement to that illustrated in FIGS. 5 to 7.

The lower conductive patterns 13 may be attached on the external pads 19. The lower conductive patterns 13 may include a first lower conductive pattern 13A (attached to the first external pad 19A) and a second lower conductive pattern 13B (attached to the second external pad 19B).

The first lower conductive pattern 13A may be electrically connected to the semiconductor chips 41 via the first external pad 19A, the lower bypass interconnection 18A, the first lower land 17A, the first upper conductive pattern 33A, the first upper land 37A, the upper bypass interconnection 38, and the inner pad 39. The second lower conductive pattern 13B may be electrically connected to the semiconductor chips 41 via the second external pad 19B, the lower bypass interconnection 18B, the second lower land 17B, the second upper conductive pattern 33B, the second upper land 37B, the upper bypass interconnection 38, and the inner pad 39.

In an implementation, the lower package 10 may be omitted. In another implementation, one or more other packages having a similar constitution or structure to the lower package 10 may be stacked between the upper package 30 and the lower package 10.

Referring to FIG. 9, warping or bowing may occur in the upper package 30 and the lower package 10. Accordingly, the upper package 30 may be bent in the shape of a bowl, and the lower package 10 may be bent in a direction opposite to the upper package 30. Thus, a gap may be created between the first upper conductive pattern 33A and the first lower land 17A. However, the inner pad 39 may still be electrically connected to the second lower conductive pattern 13B via the upper bypass interconnection 38, the second upper land 37B, the second upper conductive pattern 33B, the second lower land 17B, the lower bypass interconnection 18A, and the second external pad 19B.

Referring to FIG. 10, the upper package 30 may be bent in the shape of a tunnel, and the lower package 10 may be bent in a direction opposite to the upper package 30. Thus, a gap may be created between the second upper conductive pattern 33B and the second lower land 17B. However, the inner pad 39 may still be electrically connected to the first lower conductive pattern 13A via the upper bypass interconnection 38, the upper land 37A, the first upper conductive pattern 33A, the first lower land 17A, the lower bypass interconnection 18A, and the first external pad 19A.

Referring to FIG. 11, in an implementation, the upper package 30 may include an upper substrate 35, semiconductor chips 41, a bonding wire 43, inner pads 39, upper lands 37, an upper bypass interconnection 38, upper conductive patterns 33, and an encapsulating material 45, which may have a similar constitution or structure to those illustrated in FIG. 2.

The lower package 10 may include a lower semiconductor chip 22 attached to the lower substrate 15. The lower semiconductor chip 22 may include a plurality of through electrodes 24. At least some of the through electrodes 24 may be electrically connected to the lower semiconductor chip 22. The lower semiconductor chip 22 may be covered with a lower encapsulating material 25. The lower substrate 15 may include a plurality of lower lands 17 and a plurality of external pads 19. The lower lands 17 may include a first lower land 17A and a second lower land 17B. Intermediate conductive patterns 23 may be formed between the through electrodes 24 and the lower lands 17. The intermediate conductive patterns 23 may include a first intermediate conductive pattern 23B.

The intermediate conductive patterns 23 may be formed of one of a solder ball, a solder paste, a conductive bump, a conductive spacer, an LGA, a PGA, an ACF, and an ACP.

The first lower land 17A may be in contact with a first upper conductive pattern 33A. A second upper conductive pattern 33B may penetrate the lower encapsulating material 25 to be in contact with one of the through electrodes 24. The second lower land 17B may be electrically connected to the second upper land 37B via the first intermediate conductive pattern 23B, one of the through electrodes 24, and the second upper conductive pattern 33B. The external pads 19 may include a first external pad 19A. The first external pad 19A may be electrically connected to the first lower land 17A and the second lower land 17B via the lower bypass interconnection 18.

Lower conductive patterns 13 may be attached on the external pads 19 The lower conductive patterns 13 may include a first lower conductive pattern 13A attached to the first external pad 19A.

The first lower conductive pattern 13A may be electrically connected to the semiconductor chips 41 via the first external pad 19A, the lower bypass interconnection 18, the first lower land 17A, the first upper conductive pattern 33A, the first upper land 37A, the upper bypass interconnection 38, and the inner pad 39. In addition, the first lower conductive pattern 13A may be electrically connected to the semiconductor chips 41 via the first external pad 19A, the lower bypass interconnection 18, the second lower land 17B, the first intermediate conductive pattern 23B, one of the through electrodes 24, the second upper conductive pattern 33B, the second upper land 37B, the upper bypass interconnection 38, and the inner pad 39. For example, a dual signal transmission path may be provided between the first lower conductive pattern 13A and the inner pad 39. Accordingly, the semiconductor package according to the present embodiment may exhibit superior electrical properties and reliability.

In an implementation, the lower package 10 may be omitted. In another implementation, one or more other packages having a similar constitution or structure to the lower package 10 may be stacked between the upper package 30 and the lower package 10.

Referring to FIG. 12, in an implementation, the upper package 30 may include an upper substrate 35, semiconductor chips 41, a bonding wire 43, inner pads 39, upper lands 37, an upper bypass interconnection 38, upper conductive patterns 33, and an encapsulating material 45, which may have a similar constitution or structure to those illustrated in FIG. 8.

The lower package 10 may include a lower semiconductor chip 22 attached to a lower substrate 15. The lower semiconductor chip 22 may include a plurality of through electrodes 24. At least some of the through electrodes 24 may be electrically connected to the lower semiconductor chip 22. The lower semiconductor chip 22 may be covered with a lower encapsulating material 25. The lower substrate 15 may include a plurality of lower lands 17 and a plurality of external pads 19. The lower lands 17 may include a first lower land 17A and a second lower land 17B. Intermediate conductive patterns 23 may be formed between the through electrodes 24 and the lower lands 17. The intermediate conductive patterns 23 may include a first intermediate conductive pattern 23B.

The first lower land 17A may be in contact with a first upper conductive pattern 33A. A second upper conductive pattern 33B may penetrate the lower encapsulating material 25 to be in contact with one of the through electrodes 24. The second lower land 17B may be electrically connected to the second upper land 37B via the first intermediate conductive pattern 23B, one of the through electrodes 24, and the second upper conductive pattern 33B.

The external pads 19 may include a first external pad 19A and a second external pad 19B. The external pads 19 may face the lower lands 17. Lower bypass interconnections 18A may be provided between the external pads 19 and the lower lands 17.

A number of the lower lands 17 may be equal to or greater than a number of the upper lands 37. One-to-one correspondence may be established between the external pads 19 and the lower lands 17. In an implementation, the external pads 19 may have a similar constitution or structure to those illustrated in FIGS. 5 to 7.

The lower conductive patterns 13 may be attached on the external pads 19. The lower conductive patterns 13 may include a first lower conductive pattern 13A (attached to the first external pad 19A) and a second lower conductive pattern 13B (attached to the second external pad 19B).

The first lower conductive pattern 13A may be electrically connected to the semiconductor chips 41 via the first external pad 19A, the lower bypass interconnection 18A, the first lower land 17A, the first upper conductive pattern 33A, the first upper land 37A, the upper bypass interconnection 38, and the inner pad 39. The second lower conductive pattern 13B may be electrically connected to the semiconductor chips 41 via the second external pad 19B, the lower bypass interconnection 18B, the second lower land 17B, the first intermediate conductive pattern 23B, and one of the through electrodes 24, the second upper conductive pattern 33B, the second upper land 37B, the upper bypass interconnection 38, and the inner pad 39.

Figure 13:
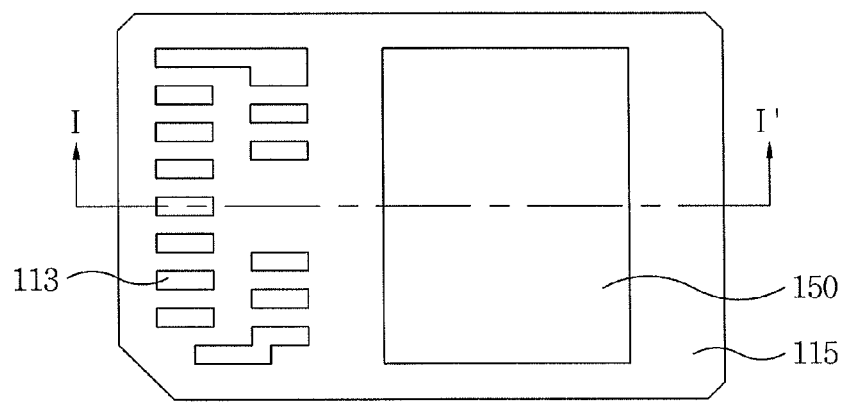
FIG. 13 illustrates a plan view of a semiconductor device according to an embodiment.
Figure 14:
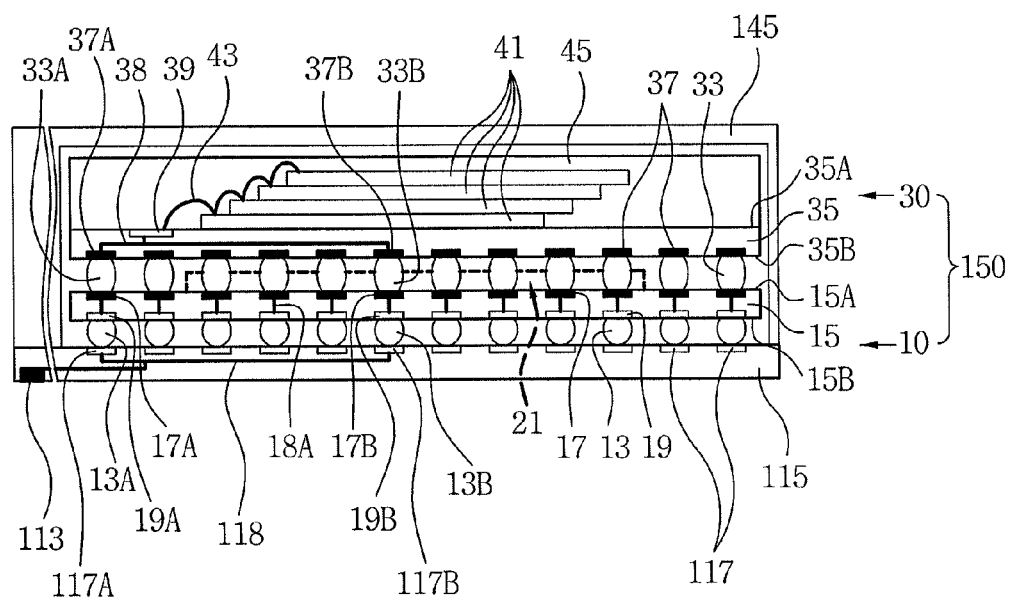
FIGS. 14 to 16 illustrate cross-sectional views taken along line I-I' of FIG. 13.
Figure 15:
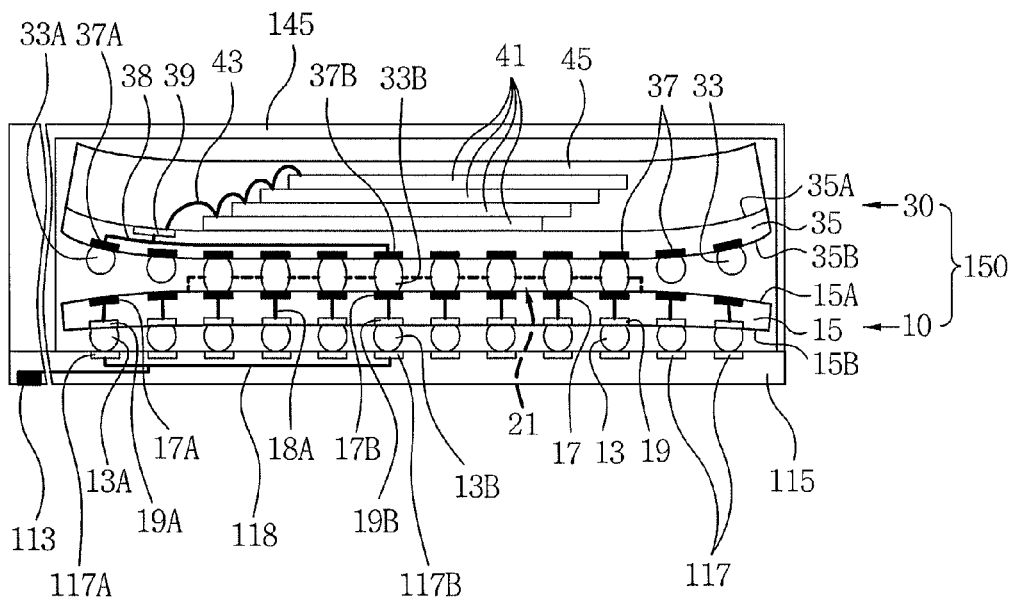
Figure 16:
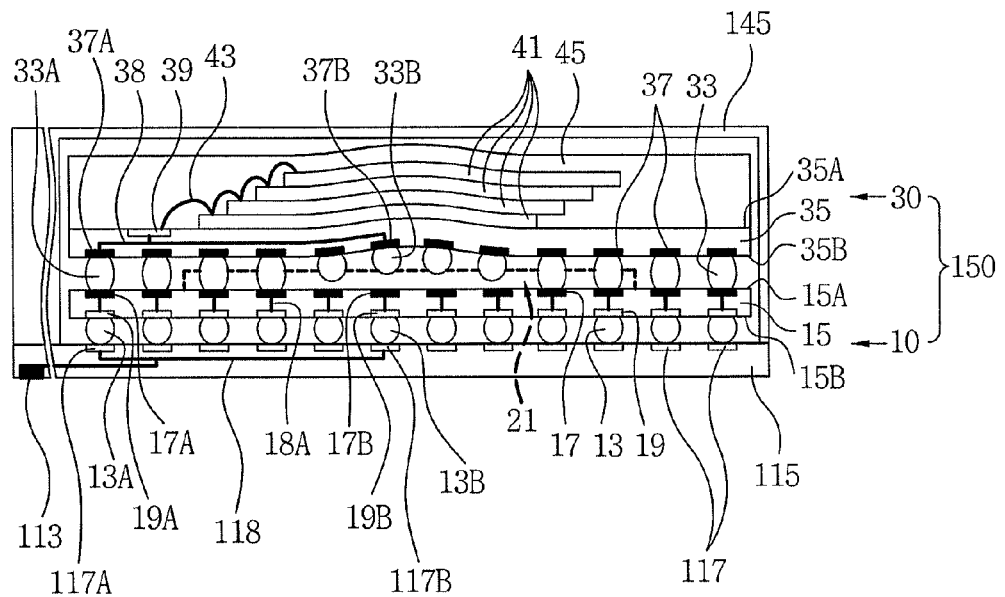

FIG. 13 illustrates a plan view of a semiconductor device according to another embodiment. FIGS. 14 to 16 illustrate cross-sectional views taken along line I-I' of FIG. 13. The semiconductor device according to the present embodiment may be a semiconductor card.

Referring to FIG. 13, the semiconductor device according to the present embodiment may include a semiconductor package 150 mounted on a mother or card board 115. A plurality of card terminals 113 may be provided on one surface of the card board 115. The semiconductor package 150 may have a similar constitution or structure to those described with reference to FIGS. 1 to 12.

Referring to FIG. 14, a plurality of card lands 117 on one surface of the card board 115 may be provided. The card lands 117 may include a first card land 117A and a second card land 117B. The first card land 117A and the second card land 117B may be electrically connected to one of the card terminals 113 via a card bypass interconnection 118 in the card board 115. An encapsulating material 145 covering the semiconductor package 150 and the semiconductor package 150 may be provided on the card board 115. The semiconductor package 150 may have a similar constitution or structure to that described with reference to FIG. 8. Lower conductive patterns 13 may be in contact with the card lands 117.

In an implementation, the lower package 10 may be omitted. Thus, the upper conductive patterns 33 may be in contact with the card lands 117. In another implementation, one or more other packages having a similar constitution or structure to the lower package 10 may be stacked between the upper package 30 and the lower package 10.

In an implementation, the card board 115 may correspond to a mother board, the card lands 117 may correspond to substrate lands, and the card bypass interconnection 118 may correspond to a base bypass interconnection.

Referring to FIG. 15, in an implementation, a semiconductor package 150 and an encapsulating material 145 covering the semiconductor package 150 may be provided on a card board 115. The card board 115 may have a similar constitution or structure to that described with reference to FIG. 14. The semiconductor package 150 may have a similar constitution or structure to that described with reference to FIG. 9, e.g., warping or bowing may occur in the upper package 30 and the lower package 10. For example, a gap may be created between the first upper conductive pattern 33A and the first lower land 17A. However, the inner pad 39 may still be electrically connected to one of the card terminals 113 via the upper bypass interconnection 38, the second upper land 37B, the second upper conductive pattern 33B, the second lower land 17B, the lower bypass interconnection 18A, the second external pad 19B, the second lower conductive pattern 13B, the second card land 117B, and the card bypass interconnection 118.

In an implementation, the lower package 10 may be omitted. Thus, when bowing or warping occurs, a gap may be created between the first upper conductive pattern 33A and the first card land 117A. However, the inner pad 39 may still be electrically connected to one of the card terminals 113 via the upper bypass interconnection 38, the second upper land 37B, the second upper conductive pattern 33B, the second card land 117B, and the card bypass interconnection 118. In another implementation, one or more other packages having a similar constitution or structure to the lower package 10 may be stacked between the upper package 30 and the lower package 10.

Referring to FIG. 16, in an implementation, a semiconductor package 150 and an encapsulating material 145 covering the semiconductor package 150 may be provided on a card board 115. The card board 115 may have a similar constitution or structure to that described with reference to FIG. 14. The semiconductor package 150 may have a similar constitution or structure to that described with reference to FIG. 10, e.g., warping or bowing may occur in the upper package 30 and the lower package 10. For example, a gap may be created between the second upper conductive pattern 33B and the second lower land 17B. However, the inner pad 39 may still be electrically connected to one of the card terminals 113 via the upper bypass interconnection 38, the first upper land 37A, the first upper conductive pattern 33A, the first lower land 17A, the lower bypass interconnection 18A, the first external pad 19A, the first lower conductive pattern 13A, the first card land 117A, and the card bypass interconnection 118.

In an implementation, the lower package 10 may be omitted. Thus, when bowing or warping occurs, a gap may be created between the second upper conductive pattern 33B and the second card land 117B. However, the inner pad 39 may still be electrically connected to one of the card terminals 113 via the upper bypass interconnection 38, the first upper land 37A, the first upper conductive pattern 33A, the first card land 117A, and the card bypass interconnection 118. In another implementation, one or more other packages having a similar constitution to the lower package 10 may be stacked between the upper package 30 and the lower package 10.

Figure 17:
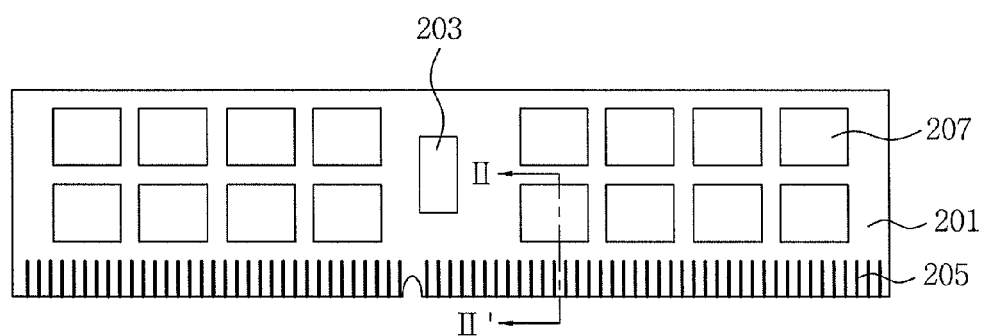
FIG. 17 illustrates a plan view of a semiconductor module according to an embodiment.
Figure 18:
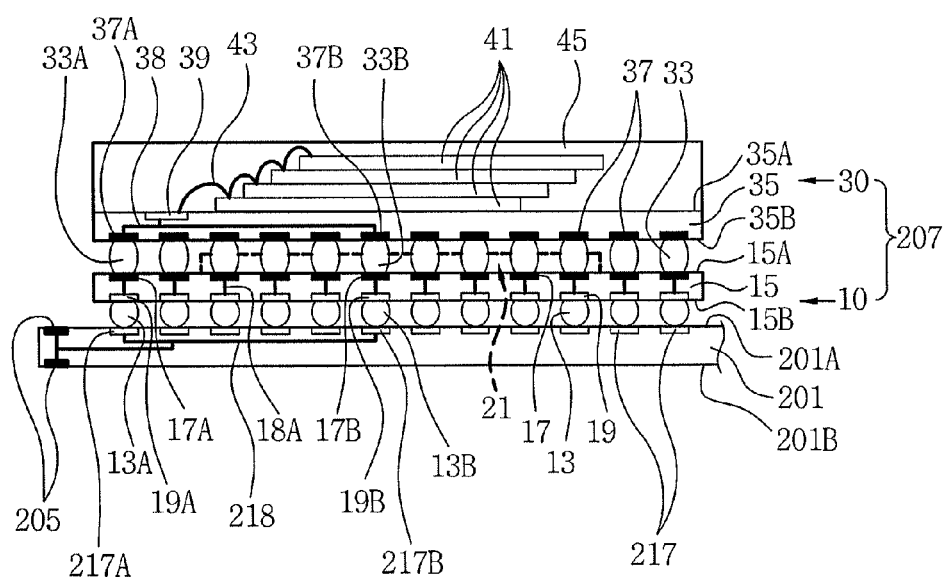
FIGS. 18 to 20 illustrate cross-sectional views taken along line II-II' of FIG. 17.
Figure 19:
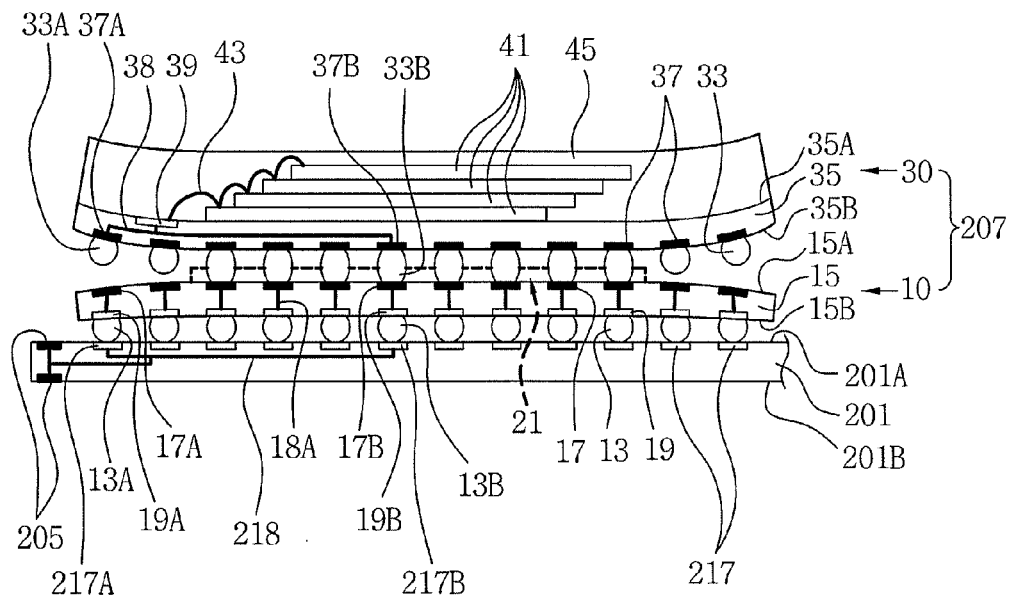
Figure 20:
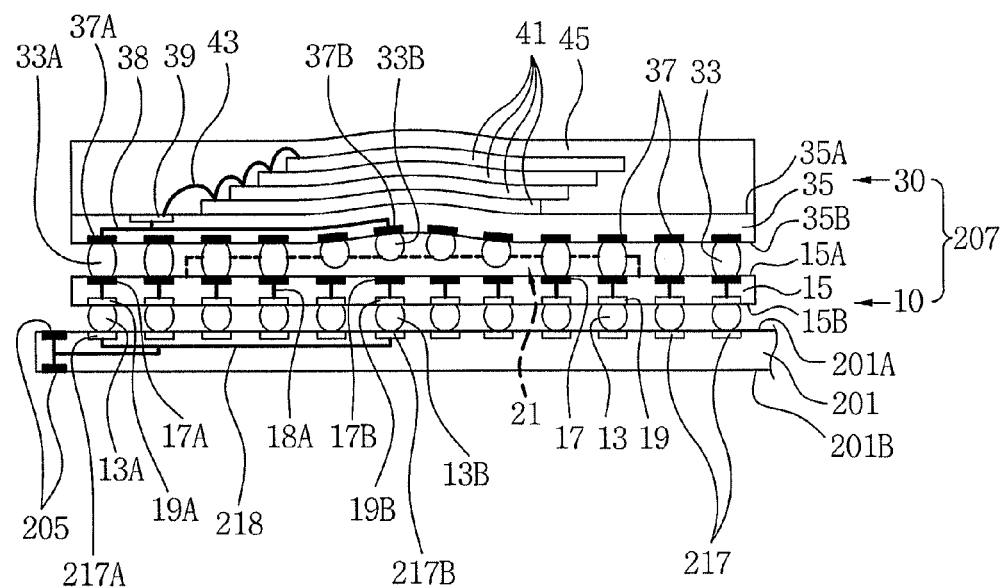

FIG. 17 illustrates a plan view of a semiconductor module according to an embodiment. FIGS. 18 to 20 illustrate cross-sectional views taken along line II-II' of implementations of the semiconductor module of FIG. 17.

Referring to FIG. 17, the semiconductor module according to the present embodiment may include a module substrate 201, a plurality of semiconductor packages 207, and a control chip package 203. Input/output terminals 205 may be formed in the module substrate 201. The semiconductor packages 207 may have a similar constitution or structure to those described with reference to FIGS. 1 to 12.

Referring to FIG. 18, in an implementation, a plurality of module lands 217 may be formed on a front side 201A of the module substrate 201. The module lands 217 may include a first module land 217A and a second module land 217B. The first module land 217A and the second module land 217B may be electrically connected to one of the input/output terminals 205 via a module bypass interconnection 218 formed in the module substrate 201. The semiconductor packages 207 may have a similar constitution or structure to that described with reference to FIG. 8. In this case, the lower conductive patterns 13 may be in contact with the module lands 217.

In an implementation, the lower package 10 may be omitted. In this case, the upper conductive patterns 33 may be in contact with the module lands 217. In another implementation, one or more other packages having a similar constitution or structure to the lower package 10 may be stacked between the upper package 30 and the lower package 10.

In an implementation, the module substrate 201 may correspond to a mother board, the module lands 217 may correspond to substrate lands, and the module bypass interconnection 218 may correspond to a base bypass interconnection.

In another implementation, other module lands (not shown) and other semiconductor packages (not shown) having a similar constitution or structure to the module lands 217 and the semiconductor packages 207 may be provided on a rear side 201B of the module substrate 201 as well.

In FIG. 19, in an implementation, semiconductor packages 207 may be mounted on a module substrate 201. The module substrate 201 may have a similar constitution or structure to that described with reference to FIG. 18. The semiconductor package 207 may have a similar constitution or structure to that described with reference to FIG. 9, e.g., warping or bowing may occur in the upper package 30 and the lower package 10. For example, a gap may be created between the first upper conductive pattern 33A and the first lower land 17A. However, the inner pad 39 may still be electrically connected to one of the input/output terminals 205 via the upper bypass interconnection 38, the second upper land 37B, the second upper conductive pattern 33B, the second lower land 17B, the lower bypass interconnection 18A, the second external pad 19B, the second lower conductive pattern 13B, the second module land 217B, and the module bypass interconnection 218.

In an implementation, the lower package 10 may be omitted. Thus, when warping or bowing occurs, a gap may be created between the first upper conductive pattern 33A and the first module land 217A. However, the inner pad 39 may still be electrically connected to one of the input/output terminals 205 via the upper bypass interconnection 38, the second upper land 37B, the second upper conductive pattern 33B, the and second module land 217B, and the module bypass interconnection 218. In another implementation, one or more other packages having a similar constitution or structure to the lower package 10 may be stacked between the upper package 30 and the lower package 10.

Referring to FIG. 20, in an implementation, semiconductor packages 207 may be mounted on a module substrate 201. The module substrate 201 may have a similar constitution or structure to that described with reference to FIG. 18. The semiconductor packages 207 may have a similar constitution or structure to that described with reference to FIG. 10, e.g., a tunnel-like deformation may occur. In this case, a gap may be created between the second upper conductive pattern 33B and the second lower land 17B. However, the inner pad 39 may still be electrically connected to one of the input/output terminals 205 via the upper bypass interconnection 38, the upper land 37A, the first upper conductive pattern 33A, the first lower land 17A, the lower bypass interconnection 18A, the first external pad 19A, the first lower conductive pattern 13A, the first module land 217A, and the module bypass interconnection 218.

In an implementation, the lower package 10 may be omitted. In this case, a gap may be created between the second upper conductive pattern 33B and the second module land 217B. However, the inner pad 39 may still be electrically connected to one of the input-output terminals 205 via the upper bypass interconnection 38, the upper land 37A, the first upper conductive pattern 33A, the first module land 117A, and the module bypass interconnection 218. In another implementation, one or more other packages having a similar constitution or structure to the lower package 10 may be stacked between the upper package 30 and the lower package 10.

Figure 21:
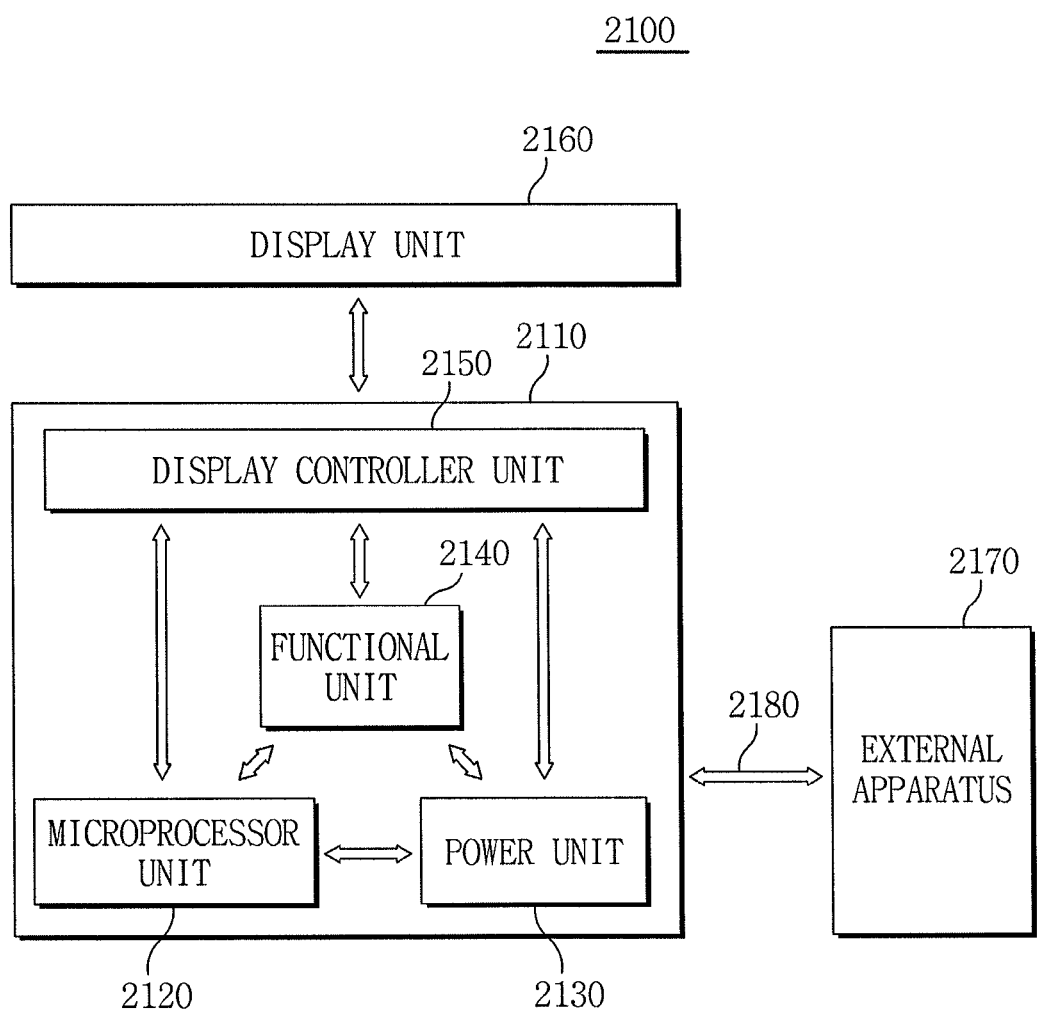
FIG. 21 illustrates a system block diagram of an electronic device according to an embodiment.

FIG. 21 illustrates a system block diagram of an electronic device according to still another embodiment.

Referring to FIG. 21, an electronic system 2100 according to the present embodiment may include, e.g., a body 2110, a microprocessor unit 2120, a power unit 2130, a functional unit 2140 and, a display controller unit 2150. At least one of the microprocessor unit 2120 and the functional unit 2140 may have a similar constitution or structure to those described with reference to FIGS. 1 to 12. For example, the lower conduction patterns 13 may be arranged within the microprocessor unit 2120 and/or the functional unit 2140. Further, the lower conduction patterns 13 may be connected to substrate lands (not shown) formed in the body 2110.

The body 2110 may be a mother board formed of a printed circuit board (PCB). The microprocessor unit 2120, the power unit 2130, the functional unit 2140, and the display controller unit 2150 may be mounted on the body 2110. A display unit 2160 may be arranged in or on the body 2110. For example, the display unit 2160 may be arranged on the surface of the body 2110 to display an image processed by the display controller unit 2150.

The power unit 2130 may be supplied with a predetermined voltage from an external battery (not shown) and may divide the received voltage to a required voltage level to supply the result to the microprocessor unit 2120, the functional unit 2140, the display controller unit 2150, etc. The microprocessor unit 2120 may receive a voltage from the power unit 2130 and may control the functional unit 2140 and the display unit 2160. The functional unit 2140 may perform various functions of the electronic system 2100. For example, when the electronic system 2100 is a cellular phone, the functional unit 2140 may include components capable of performing mobile phone functions including, e.g., outputting an image to the display unit 2160 and outputting a voice to a speaker, by dialing or communication with an external apparatus 2170, and, when a camera is mounted, the system may function as a camera image processor.

In an implementation, when the electronic system 2100 is connected to a memory card for the capacity expansion, the functional unit 2140 may be a memory card controller. The functional unit 2140 may transmit or receive a signal to or from the external apparatus 2170 via a wired or wireless communication unit 2180. When the electronic system 2100 requires a universal serial bus (USB) for the function expansion, the functional unit 2140 may function as an interface controller.

According to the embodiments, a substrate including a bypass interconnection and two lands connected to the bypass interconnection may be provided. For example, the embodiments provide a semiconductor package having a dual ball land and an electronic device employing the same. A semiconductor chip may be bonded to the substrate. The lands may be connected to another semiconductor package or another substrate via a conductive pattern, e.g., a solder ball. The two lands connected to the bypass interconnection may provide a dual signal transmission path. Accordingly, a semiconductor package and a semiconductor device having a controlled thickness and exhibiting excellent electrical properties and reliability may be implemented.

The embodiments may avoid many problems brought on by stacking the semiconductor packages while controlling the thicknesses thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a substrate, the substrate having a plurality of inner pads;
a semiconductor chip attached to the substrate, the semiconductor chip being electrically connected to the inner pads;
a plurality of lands on the substrate, the plurality of lands being electrically connected to the inner pads;
at least one bypass interconnection on the substrate;
a lower substrate attached to the substrate, the lower substrate having lower lands respectively corresponding to the plurality of lands; and
a lower semiconductor chip attached to the lower substrate, wherein:
the plurality of lands includes a first land and a second land,
the bypass interconnection is connected to the first land and the second land, and
the first land is spaced apart from the second land by a distance of about three times or greater an average distance between adjacent lands of the plurality of lands.

2. The package as claimed in claim 1, wherein at least two other lands of the plurality of lands are between the first land and the second land.

3. The package as claimed in claim 1, wherein a number of the plurality of lands is about 1.2 to about 2 times a number of the inner pads.

4. The package as claimed in claim 1, wherein:
the first land is adjacent to a corner of the substrate, and
the second land is adjacent to a center of the substrate.

5. The package as claimed in claim 1, wherein the plurality of lands includes:
a first group arranged in a row direction, and
a second group extending from one end of the first group and arranged in a column direction, the first land being adjacent to a center of the first group and the second land being adjacent to a center of the second group.

6. The package as claimed in claim 1, further comprising conductive patterns attached to the lands, wherein the conductive patterns are formed of one of a solder ball, a solder paste, a conductive bump, a conductive spacer, a lead grid array (LGA), a pin grid array (PGA), an anisotropic conductive film (ACF), and an anisotropic conductive paste (ACP).

7. The package as claimed in claim 6, wherein:
the conductive patterns include a first conductive pattern and a second conductive pattern, and
the lower lands include a first lower land and a second lower land, the first conductive pattern being in contact with the first land and the first lower land, and the second conductive pattern being in contact with the second land and the second lower land.

8. The package as claimed in claim 6, wherein:
the conductive patterns include a first conductive pattern and a second conductive pattern, and
the lower lands include a first lower land and a second lower land, the first conductive pattern being in contact with the first land and the first lower land, and the second conductive pattern being in contact with the second land and separated from the second lower land.

9. The package as claimed in claim 1, wherein the lower lands include a first lower land and a second lower land and the lower substrate includes:
a plurality of external pads electrically connected to the lower lands; and
a lower bypass interconnection on the lower substrate, the lower bypass interconnection being connected to the first lower land and the second lower land.

10. A semiconductor module, comprising:
a module substrate, the module substrate including input/output terminals thereon;
a control chip package on the module substrate; and
a plurality of semiconductor packages as claimed in claim 1 on the module substrate.

11. A semiconductor device, comprising:
a mother board, the mother board having a plurality of substrate lands;
an upper substrate on the mother board, the upper substrate having a plurality of inner pads;
a semiconductor chip attached to the upper substrate, the semiconductor chip being electrically connected to the inner pads;
a plurality of upper lands on the upper substrate, the plurality of upper lands being electrically connected to the inner pads and the substrate lands; and
at least one upper bypass interconnection on the upper substrate, wherein:
the plurality of upper lands includes a first upper land and a second upper land,
the at least one upper bypass interconnection is connected to the first upper land and the second upper land, and
the first upper land is spaced apart from the second upper land by a distance of about three times or greater an average distance between adjacent upper lands of the plurality of upper lands.

12. The device as claimed in claim 11, further comprising upper conductive patterns attached to the upper lands, wherein the upper conductive patterns are formed of one of a solder ball, a solder paste, a conductive bump, a conductive spacer, an LGA, a PGA, an ACF, and an ACP.

13. The device as claimed in claim 12, wherein:
the upper conductive patterns include a first upper conductive pattern and a second upper conductive pattern, and
the substrate lands include a first substrate land facing the first upper land and a second substrate land facing the second upper land, the first upper conductive pattern being between the first upper land and the first substrate land, and the second upper conductive pattern being between the second upper land and the second substrate land.

14. The device as claimed in claim 13, further comprising a base bypass interconnection on the mother board, wherein the base bypass interconnection is connected to the first substrate land and the second substrate land.

15. The device as claimed in claim 11, wherein:
the first upper land is adjacent to a corner of the upper substrate, and
the second upper land is adjacent to a center of the upper substrate.

16. The device as claimed in claim 11, wherein the plurality of upper lands include:
a first group arranged in a row direction, and
a second group extending from one end of the first group and arranged in a column direction, the first upper land being adjacent to a center of the first group, and the second upper land being adjacent to a center of the second group.

17. The device as claimed in claim 11, further comprising:
a lower substrate attached between the mother board and the upper substrate, the lower substrate including lower lands respectively corresponding to the upper lands, a plurality of external pads corresponding to the substrate lands, and a plurality of lower bypass interconnections connected to the lower lands and the external pads;
a lower semiconductor chip attached to the lower substrate; and
lower conductive patterns between the external pads and the substrate lands.

18. The device as claimed in claim 17, wherein:
the lower lands include a first lower land facing the first upper land and a second lower land facing the second upper land, and
one of the lower bypass interconnections:
is connected to the first lower land and the second lower land, and
is connected to one of the external pads.

19. The device as claimed in claim 18, wherein:
the external pads include a first external pad facing the first lower land and a second external pad facing the second lower land,
the substrate lands include a first substrate land facing the first external pad and a second substrate land facing the second external pad, and
the lower conductive patterns include a first lower conductive pattern between the first external pad and the first substrate land and a second conductive pattern between the second external pad and the second substrate land.

* * * * *